US006127852A

United States Patent [19]

Ogawa et al.

[11] Patent Number: 6,127,852

[45] Date of Patent: Oct. 3, 2000

[54] SEMICONDUCTOR INTEGRATED CIRCUIT FOR PARALLEL SIGNAL PROCESSING

[75] Inventors: Katsuhisa Ogawa, Machida; Tadahiro Ohmi, Sendai; Tadashi Shibata, Tokyo, all of Japan

[73] Assignee: Canon Kabushiki Kaisha, Tokyo, Japan

[21] Appl. No.: 09/110,014

[22] Filed: Jul. 2, 1998

[30] Foreign Application Priority Data

Jul. 2, 1997 [JP] Japan .................................... 9-176870

[51] Int. Cl.$^7$ ....................................................... H03D 1/00

[52] U.S. Cl. ................................ 327/50; 327/53; 327/62; 327/72

[58] Field of Search ................................. 327/50, 51, 52, 327/53, 56, 60, 62, 63, 69, 72, 97, 403, 404; 365/185.01, 185.03, 185.08, 185.21, 185.26

[56] References Cited

U.S. PATENT DOCUMENTS

| | | | |
|---|---|---|---|
| 5,408,194 | 4/1995 | Steinbach et al. | 327/62 |
| 5,541,444 | 7/1996 | Ohmi et al. | 257/587 |
| 5,703,503 | 12/1997 | Miyamoto et al. | 327/58 |
| 5,835,045 | 11/1998 | Ogawa et al. | 341/155 |
| 5,852,416 | 12/1998 | Ohmi et al. | 341/144 |
| 5,905,387 | 5/1999 | Chinosi et al. | 327/62 |

OTHER PUBLICATIONS

G. Cauwenberghs et al., "A Charge–Based CMOS Parallel Analog Vector Quantizer", Advances in Neural Information Processing Systems 7, 1995, pp. 779–786.

J. Lazzaro et al., "Winner–Take–All Networks of O(N) Complexity," Advances in Neural Information Processing Systems 1, 1989, pp. 703–711.

*Primary Examiner*—Timothy P. Callahan
*Assistant Examiner*—Hai L. Nguyen
*Attorney, Agent, or Firm*—Fitzpatrick, Cella, Harper & Scinto

[57] ABSTRACT

To retrieve analog signals at high precision by a maximum or minimum position detection parallel signal processing circuit, a plurality of circuit units in each of which a gate of a transistor is connected to a signal input terminal through first capacitive means, a common connecting point of the gate and the first capacitive means is connected to one terminal side of second capacitive means, and control means, for fluctuating a voltage on the other terminal side of the second capacitive means so as to further increase or decrease a drain current in correspondence to an increase or decrease in the drain current is connected between the drain and the other terminal side of the second capacitive means are provided, a source of each transistor of the plurality of circuit units is commonly connected and is connected to a constant current source, and the maximum or minimum voltage position detection with respect to a signal voltage which is applied to each signal input terminal is performed by a voltage on the other terminal side of the second capacitive means.

10 Claims, 10 Drawing Sheets

SEMICONDUCTOR INTEGRATED CIRCUIT FOR PARALLEL SIGNAL PROCESSING

BACKGROUND OF THE INVENTION

1. Field of the Invention

The invention relates to a semiconductor integrated circuit which can perform parallel signal processes.

2. Related Background Art

In association with a rapid development of the signal processing technique, at present, attention is paid to neuro information processes such as pattern recognition, voice recognition, image understanding, and the like which are weak points for the von Neumann computer. Perfect parallel signal processes which are executed by the human brain cells are the central processes among them. If parallel comparing processes for detecting a storing position of data having the maximum or minimum value from a number of data are executed by a binary digital circuit as a main circuit of a signal processing circuit of the present LSI, an extremely large number of circuit elements and a large electric power consumption are needed and a real-time response is difficult. On the other hand, a circuit for dealing with a number of data as analog signals, executing analog signal processes as they are, and performing the parallel signal processes at a high speed has been proposed in J. Lazzaro, S. Ryckebusch, M. A. Mahowald, and C. A. Mead, "Winner-Take-All Networks of 0(n) Complexity", in Advances in Neural Information Processing Systems 1 (San Mateo, Calif.: Morgan Kaufman, 1989), pp. 703–711, and G. Gauwenberghs and V. Pedroni, "A charge-based CMOS parallel analog vector quantizer", in Advances in Neural Information Processing Systems 7 (Cambridge, Mass.: The MIT Press, 1995), pp. 779–786.

FIG. 1 shows an example of a maximum position detection parallel signal processing circuit. This circuit has N input signal data trains comprising a first input signal current 100, a second input signal current 101, and an N-th input signal current 102. One of terminals of each of the input signal currents 100, 101, and 102 is connected to a power source voltage at an input terminal 1 and another terminal to which the signal current is outputted is connected to a drain terminal of each of NMOS transistors 103, 104, and 105 whose sources are connected to the ground. Gate terminals of the NMOS transistors 103, 104, and 105 are commonly connected. Gate terminals of NMOS transistors 106, 107, and 108 are connected to the drain terminals of the NMOS transistors 103, 104, and 105. Source terminals of the NMOS transistors 106, 107, and 108 are connected to the commonly connected gate terminals of the NMOS transistors 103, 104, and 105. A current source Ic 109 is connected between a ground potential at an input terminal 2 and common connecting point of the gate terminals of the NMOS transistors 103, 104, and 105 and the sources of the NMOS transistors 106, 107, and 108. It is now assumed that a current value of the input signal current source 100 is labelled as I1, a current value of the input signal current source 101 is set to I2, and a current value of the input signal current source 102 is shown by In, there are relations of (I2=In) and (I1>I2=In), and I1 is the largest among the input data trains. All of the NMOS transistors 103, 104, 105, 106, 107, and 108 operate in a sub threshold region which is fairly lower than a threshold value Vth of the NMOS. When the input currents I1, I2, and In are inputted to the NMOS transistors 103, 104, and 105, respectively, a voltage between the gate and source of each transistor rises. However, since each gate terminal is commonly connected, the gate-source voltage of the NMOS transistor 103 to which the maximum current I1 is supplied becomes dominant. A gate common electric potential of each of the NMOS transistors 103, 104, and 105 is set to Vc=Vo·In(I2/Io) (Vo=KT/q: Io is a constant). When the gates of the NMOS transistors 104 and 105 are biased by Vc, it is intended to drive the drain terminals so as to pull in drain currents to a current equivalent to I1. However, since the currents I2 and In which are supplied to the drain terminals of the NMOS transistors 104 and 105 are smaller than I1, by reducing each drain-source voltage, the drain currents of the NMOS transistors 104 and 105 are set to I2 and In. Therefore, voltages of the drain terminals of the NMOS transistors connected to the input current sources other than the maximum input current are reduced. Consequently, gate electric potentials of the NMOS transistors 107 and 108 decrease and only a gate electric potential of the NMOS transistor 106 to which the maximum current is inputted rises. A voltage at the common connecting point of the gate terminal of the NMOS transistor 106 at this time and the drain terminal of the NMOS transistor 103 is equal to the sum $$Vi1 = Vo \cdot In(I1/Io) + Vo \cdot In(Ic/Io)$$

of the gate-source voltages of the transistors. Therefore, the current Ic of the current source 109 is concentrated to the NMOS transistor 106 to which the maximum current is inputted. As mentioned above, by monitoring the gate voltages of the NMOS transistors 106, 107, and 108, the voltage is developed in only the cell to which the maximum input current is supplied and the voltages of the other cells are suppressed to 0. Thus, the maximum position of the signal can be detected by the parallel processes.

In the case where it is intended to retrieve the analog signals at high precision by using the maximum position detection parallel signal processing circuit shown in FIG. 1, however, there are several problems. If the input current such that a difference from the maximum input signal current value is very small exists, the drain terminal voltage of the NMOS transistor to which such an input current is supplied is not equal to 0 but slightly decreases to a value for the drain terminal voltage of the NMOS transistor to which the maximum current is inputted. Therefore, a high precision voltage comparator is needed to a circuit of the maximum position detecting system of post processes, thereby making the circuit complicated. Due to a variation in threshold values Vth of the NMOS transistors, even in case of the same current input, gate-source voltages Vgs which are generated differ. There is a problem that the magnitudes of the analog signals cannot be accurately compared. Since the operating mode of the MOS of the circuit in the conventional example is operative in the sub threshold region in which the gate-source voltage Vgs is equal to or less than Vth, the current for the voltage is exponentially determined. Therefore, a value of the set current value for the voltage variation also exponentially varies and causes a deterioration in detecting precision.

SUMMARY OF THE INVENTION

The invention is made in consideration of the above problems and it is an object of the invention to provide a semiconductor integrated circuit which can realize a discrimination of analog input signals having small differences and can perform a parallel retrieval of a number of analog signals without making the circuit complicated.

Another object of the invention is to provide a semiconductor integrated circuit which can perform parallel signal processes at high precision and with a low electric power consumption and can remarkably improve a real-time performance of the signal processes.

It is still another object of the invention to provide a semiconductor integrated circuit in which a plurality of circuit units each of which is constructed in a manner such that a gate of an insulating gate type transistor is connected to a signal input terminal through first capacitive means, a common connecting point serving as a floating point of the gate and the first capacitive means is connected to one terminal side of second capacitive means, and control means for fluctuating a voltage on the other terminal side of the second capacitive means so as to further increase or decrease a drain current of the insulating gate type transistor in correspondence to an increase or decrease of the drain current of the insulating gate type transistor is connected between a drain of the insulating gate type transistor and the other terminal side of the second capacitive means are provided, and sources of the insulating gate type transistors of the plurality of circuit units are commonly connected and are connected to a constant current source, wherein each of the circuit units constructs a positive feedback loop for further increasing or decreasing the drain current in accordance with the increase or decrease of a source current of the insulating gate type transistor and, further, has a terminal for outputting a maximum voltage position or a minimum voltage position with respect to a signal voltage which is applied to each signal input terminal of the plurality of circuit units by the voltage at the other terminal side of the second capacitive means.

According to the semiconductor integrated circuit with the above construction, the whole current of the constant current source is finally concentrated due to a positive feedback effect into a current input voltage output positive feedback loop circuit having the largest or smallest comparison reference voltage among a plurality of comparison reference voltages (signal voltages) as an input signal. Therefore, the output of only the cell of the maximum or minimum input can be detected even by a small difference of the input analog signals. The detection of the maximum or minimum position of the input analog signals at high precision is realized by a circuit having a small number of elements. A degree of integration can be remarkably improved.

In the above semiconductor integrated circuit, it is an object of the invention to provide a semiconductor integrated circuit, wherein the integrated circuit has a plurality of voltage input current output differential amplifiers corresponding to the plurality of circuit units, an inverting input terminal of each voltage input current output differential amplifier is connected to the other terminal of the second capacitive means of the corresponding circuit unit, an output of each voltage input current output differential amplifier is connected to one terminal of the second capacitive means of the corresponding circuit unit, a non-inverting input terminal of each voltage input current output differential amplifier is commonly connected and is connected to a reference power source potential, and the voltage input current output differential amplifier constructs an offset correcting circuit.

According to the semiconductor integrated circuit with the above construction, an offset of the current input voltage output positive feedback loop circuit due to the variation in Vth of the insulating gate type transistors on manufacturing is detected by the differential amplifier and a correction value is written to a floating node of one terminal of the second capacitive means, thereby raising analog signal detecting precision of the current input voltage output positive feedback loop circuit and enabling a magnitude relation among the analog signals having only small differences to be discriminated. Since the circuit has a simple construction, the offset cancelling function can be added to each of the current input voltage output positive feedback loop circuits serving as each cell. In the case where it is intended to realize the comparison and reference of a number of data trains on a chip, a chip area occupied in the circuit increases and a relative variation in Vth in the chip occurs. However, it can be perfectly cancelled by the offset cancelling function and an input data maximum position detecting circuit (or input data minimum position detecting circuit) having stable temperature characteristics can be realized.

According to the above proposition, the perfect parallel signal processes which need a large number of circuit elements and a large electric power consumption in the existing binary digital circuit are analog processed at high precision by using the present invention, thereby enabling the above detecting circuit to be constructed with a simple circuit construction and with a low electric power consumption. The real-time performance of the signal processes can be remarkably improved.

DETAILED DESCRIPTION OF THE PREFERRED EMBODIMENTS

Embodiments according to the invention will now be described in detail hereinbelow with reference to the drawings.

[First Embodiment]

Figure 2:
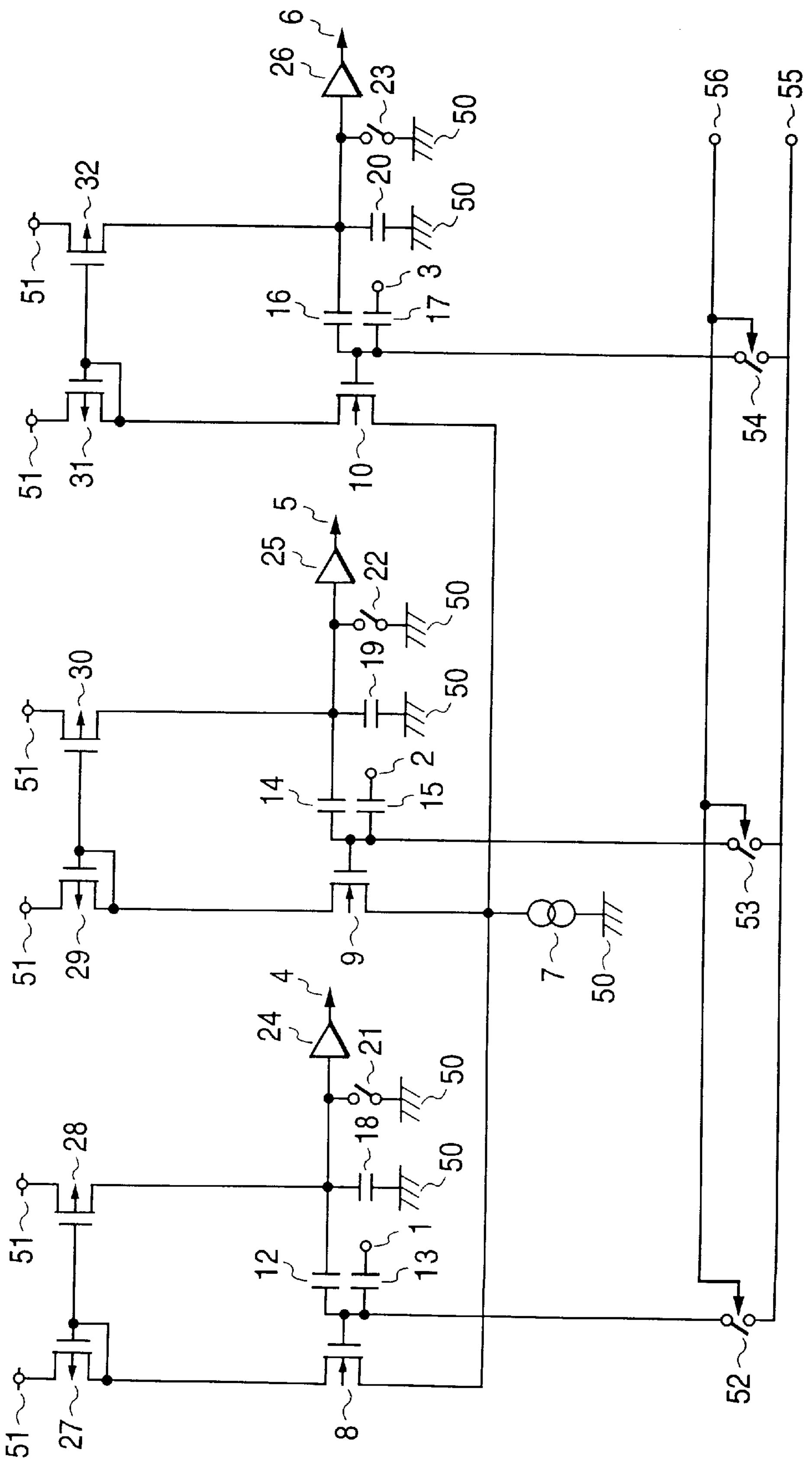
FIG. 2 is a circuit diagram showing the first embodiment of the invention.

FIG. 2 is a circuit diagram of an N input data maximum position detecting circuit showing the first embodiment of the invention. In case of comparing N data trains, a first input data voltage V1 is inputted to the input terminal 1, a second input data voltage V2 is inputted to the input terminal 2, and an N-th input data voltage Vn is inputted to an input terminal 3, respectively. For convenience of explanation, the third to (N−1)th input data is omitted because it is assumed that voltages smaller than the input data voltages V1, V2, and Vn are inputted.

The input data voltages V1, V2, and Vn applied to the input terminals 1, 2, and 3 are connected to capacitive means 13, 15, and 17, respectively. The other terminals of the capacitive means 13, 15, and 17 are connected to capacitive means 12, 14, and 16 and gate terminals of NMOS transistors 8, 9, and 10, thereby forming first, second, and third floating points, respectively. Switching means 52, 53, and 54 are connected to the first, second, and third floating points, respectively. The other terminals of the switching means 52, 53, and 54 are connected to a first reference power source 55. Source terminals of the NMOS transistors 8, 9, and 10 are commonly connected. A constant current source 7 having a value of Iw is connected between the common connecting point and a ground potential 50 (serving as a low voltage side power source potential). Drain terminals of the NMOS transistors 8, 9, and 10 are connected to PMOS transistors 27, 29, and 31 in each of which a gate and a source are connected. Gate-source common connecting points of the PMOS transistors 27, 29, and 31 are connected to gates of PMOS transistors 28, 30, and 32. Each pair of PMOS transistors 27 and 28, PMOS transistors 29 and 30, and PMOS transistors 31 and 32 constructs a current mirror circuit. Mirror values of the drain currents I1, I2, and In of the NMOS transistors 8, 9, and 10 are extracted as drain currents Id28, Id30, and Id32 of the PMOS transistors 28, 30, and 32, respectively. Drains of the PMOS transistors 27 to 32 are connected to a power source potential 51 (serving as a high voltage side power source potential). The drain terminals of the PMOS transistors 28, 30, and 32 are connected to capacitive means 18, 19, and 20, capacitive means 12, 14, and 16, switching means 21, 22, and 23, and buffer inverters 24, 25, and 26, thereby constructing fourth, fifth, and sixth floating points, respectively. Processing results of the buffer inverters 24, 25, and 26 are extracted from output terminals 4, 5, and 6, respectively.

The operation of the maximum data position detecting circuit will now be described with reference to operation principle diagrams shown in FIGS. 3 to 5. Only an output of the circuit to which the largest data is inputted among the N data groups applied to the input terminals 1, 2, and 3 is fundamentally set to the "H" level.

Figure 3:
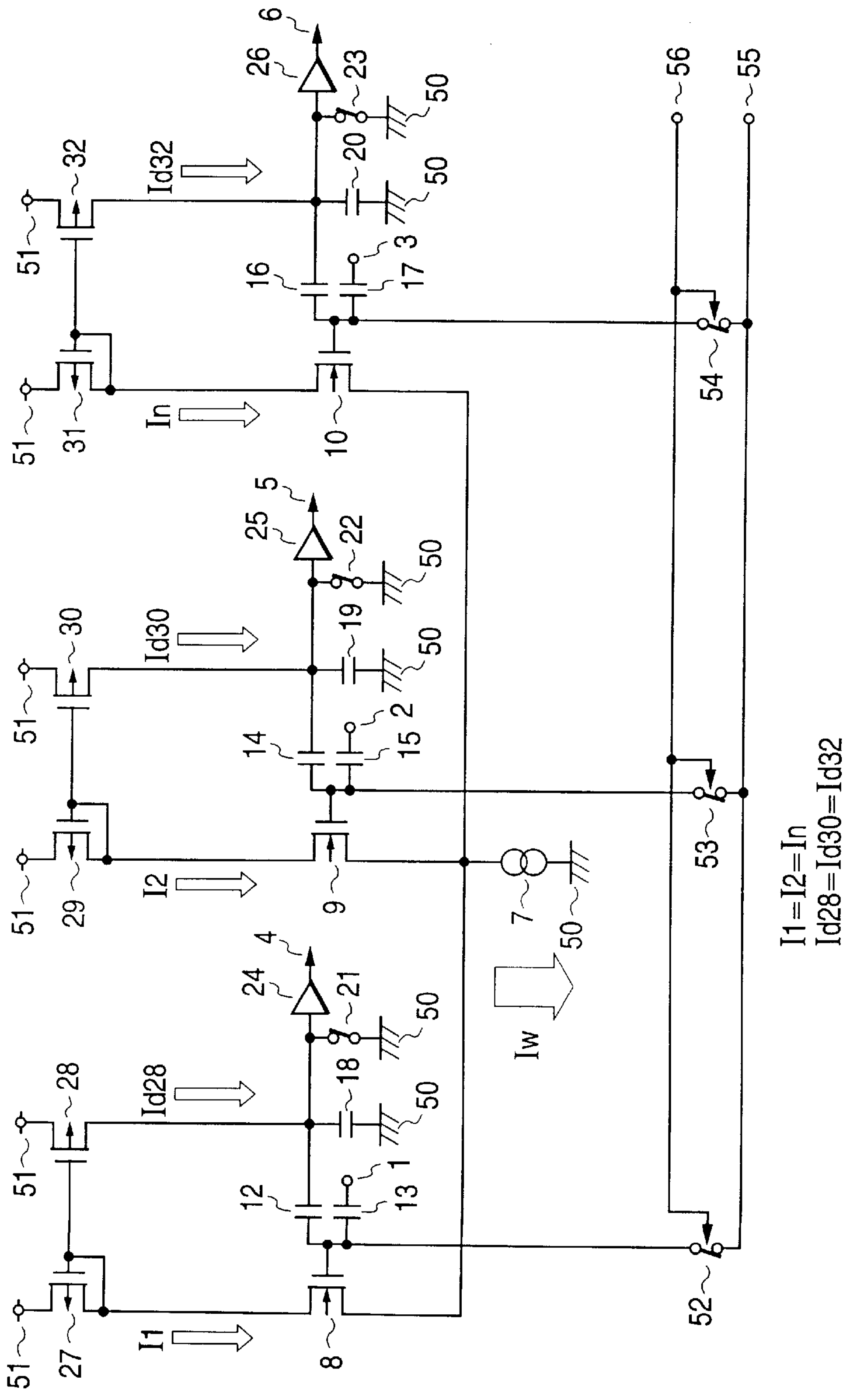
FIG. 3 is an operation explanatory diagram of a resetting mode of the first embodiment.

FIG. 3 is an operation principle diagram in the resetting mode in the embodiment. The resetting mode corresponds to a period of time provided for the initial setting of each voltage node before the comparison voltages V1, V2, and Vn are inputted to the input terminals 1, 2, and 3. A first control terminal 56 is activated, the switching means 52, 53, and 54 are turned on, and the first reference voltage 55 is applied to the input terminals 1, 2, and 3, respectively. Thus, the first, second, and third floating points are charged to the first reference voltage 55 and initial charges of the capacitive means 13, 15, and 17 are set to 0. The switching means 21, 22, and 23 connected to the capacitive means 18, 19, and 20 serving as the fourth, fifth, and sixth floating points are turned on and initial charges of the capacitive means 18, 19, and 20 are set to 0, respectively. In this resetting state, the gate terminals of the NMOS transistors 8, 9, and 10 as amplifiers for positive feedback amplification having a common source connection, namely, the first, second, and third floating points are set to the reference voltage 55 together with the respective transistors. Therefore, the drain currents I1, I2, and In of the NMOS transistors 8, 9, and 10 as amplifiers for positive feedback amplification are equalized and (I1=I2=In) is satisfied (values of the currents I3 to In−1 omitted in the above description are likewise equal to I1=I2=In). The drain currents I1, I2, and In are mirrored to the PMOS transistors of the current mirror circuit pairs (27 and 28), (29 and 30), and (31 and 32) and are supplied to the fourth, fifth, and sixth floating points as drain currents Id28, Id30, and Id32 of the PMOS transistors 28, 30 and 32 as outputs of the current mirror circuits. However, since the switching means 21, 22, and 23 are ON, the electric potentials are fixed to the ground potential 50 and do not charge the capacitive means 18, 19, and 20. In the resetting mode, initial charges of the capacitive means 18, 19, and 20 are set to 0. The constant current Iw of the constant current source 7 is equally divided and shunted to each current input voltage output positive feedback circuit. An operating point is set to I1=Id28=I2=Id30=In=Id32 by using the current mirror circuits and the apparatus enters a standby mode.

Figure 4:
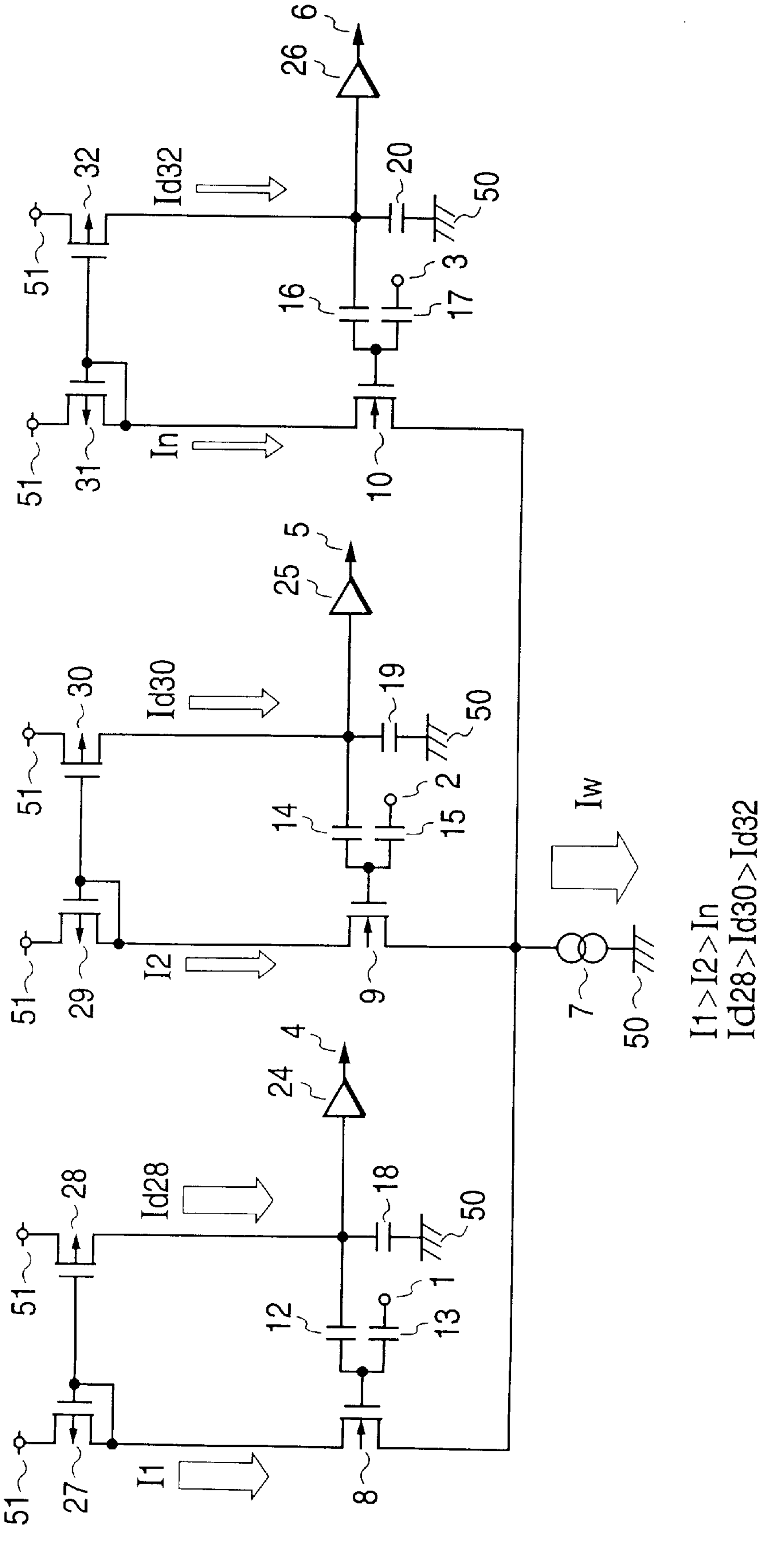
FIG. 4 is an operation explanatory diagram during a maximum position detecting process of the first embodiment.

FIG. 4 is an operation explanatory diagram during the maximum position detecting process after the signal input. The switching means 52, 53, and 54 are turned off, the first, second, and third floating points are set to a perfect floating state, and the switching means 21, 22, and 23 are also turned off. Thus, the drain currents Id28, Id30, and Id32 start to charge the capacitive means 18, 19, and 20. When the data groups in which the magnitudes of the input signals have a relation of (V1>V2>Vn) are now applied to the input terminals 1, 2, and 3, respectively, gate voltages Vgs8, Vgs9, and Vgs10 of the NMOS transistors 8, 9, and 10 as the first, second, and third floating points rise in accordance with the magnitudes of the input signals. Since there is the relation of (V1>V2>Vn) among the input voltages, a relation of (Vgs8>Vgs9>Vgs10) is obtained. In this instance, since the gate potential Vgs8 of the NMOS transistor 8 is the highest, the drain current I1 of the NMOS transistor 8 increases. Since the constant current source 7 always supplies the current Iw of a predetermined value to the commonly connected source terminal as a current supply source of the NMOS transistors 8, 9, and 10 as amplifiers for positive feedback amplification, the drain current I1 of the NMOS transistor 8 increases, so that the drain currents of the other NMOS transistors decrease. Therefore, the drain currents have a relation of (I1>I2>In). The drain currents are inputted to the current mirror circuits and charge the capacitive means 18, 19, and 20. The capacitive means 18, 19, and 20 are connected to the gate terminals of the NMOS transistors 8, 9, and 10 through the capacitive means 12, 14, and 16 and form a closed loop of a positive feedback. That is, since the drain current I1 is mirrored and becomes Id28 and charges the capacitive means 18, the electric potential increases and the gate voltage Vgs8 of the NMOS transistor 8 is further raised through the capacitive means 12. Therefore, a positive feedback effect to further raise the drain current I1 functions. According to the positive feedback effect, as the drain current of the NMOS transistor as an amplifier for positive feedback amplification is larger, an increase rate is larger. The current value Iw of the constant current source set at the source common connecting terminal of each NMOS transistor as an amplifier for positive feedback amplification is constant. Thus, the drain currents have a relation of (I1>>I2>>In). Since the relation of (Iw=I1+I2+ . . . +In) is always satisfied, I2 and In decrease by the increased amount of I1. As mentioned above, the concentration of the current into the circuit which received the maximum input voltage is started.

Figure 5:
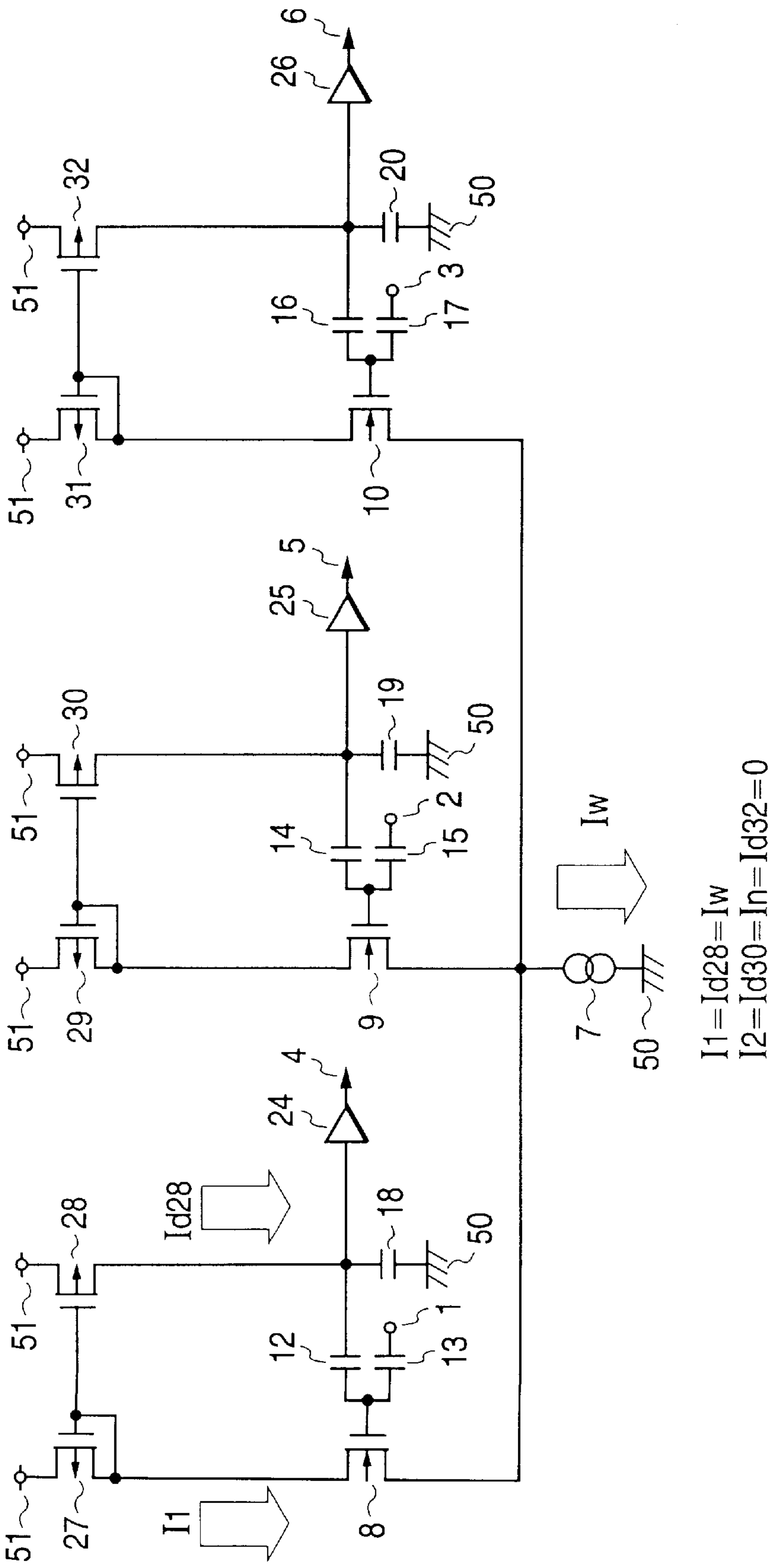
FIG. 5 is an operation explanatory diagram at the end of the maximum position detecting process of the first embodiment.

FIG. 5 is an operation explanatory diagram at the end of the maximum position detection of the input data. A competing function such that the increase in drain current I1 of the NMOS transistor 8 which received the maximum input voltage is accelerated and enhanced by the positive feedback loop and the drain currents of the other NMOS transistors for the positive feedback amplifiers are reduced occurs. Finally, since the current value Iw of the constant current source 7 set at the source common connecting terminal of each NMOS transistor for the positive feedback amplifier is constant, the current of the constant current source 7 is concentrated to the NMOS transistor 8 which received the maximum input voltage and is not distributed to the other transistors. That is, the relations of (I1=Iw and I2=In=0) are obtained and the circuit loop is converged. Therefore, the relations of (Id28=Iw and Id30=Id32=0) are obtained and the capacitive means 18 is finally charged to the power source voltage. Since the capacitive means 19 and 20 satisfy the relation of (I2=In=0), after they were charged to predetermined amounts, no current is supplied and the increase in electric potential is stopped. By setting proper logic threshold values into the buffer inverters 24, 25, and 26, only the charged voltage of the capacitive means 18 exceeds the logic threshold value, only the output terminal 4 is set to "H", and the other output terminals 5 and 6 are fixed to "L". As mentioned above, only the circuit which received the maximum input signal is activated to "H", thereby enabling the storing position of the data to be detected. By the positive feedback effect, the current of the constant current source which is commonly connected to the inputs of all of the current input voltage output positive feedback loop circuits is finally concentrated and supplied as a whole to the current input voltage output positive feedback loop circuit which received the maximum input voltage. Therefore, even when there are slight differences among the input analog signals, the output of only the cell of the maximum input is activated, the maximum position detection of the input analog signal at high precision is realized by the circuit having a small number of elements, and the integration degree is remarkably improved. By setting the operating region of the MOS transistor into the sub threshold region, the parallel processes of the maximum input position detection of a low electric power consumption and a large scale can be realized.

The capacitive means 12 and 13, NMOS transistor 8, capacitive means 14 and 15, NMOS transistor 9, capacitive means 16 and 17, and NMOS transistor 10 shown in FIG. 2 can be respectively constructed by multi-input MOS transistors having floating gate electrodes (this point shall also similarly apply to embodiments, which will be explained hereinlater). The multi-input MOS transistor can be realized by a double-layer polysilicon CMOS process or the like.

Figure 1:
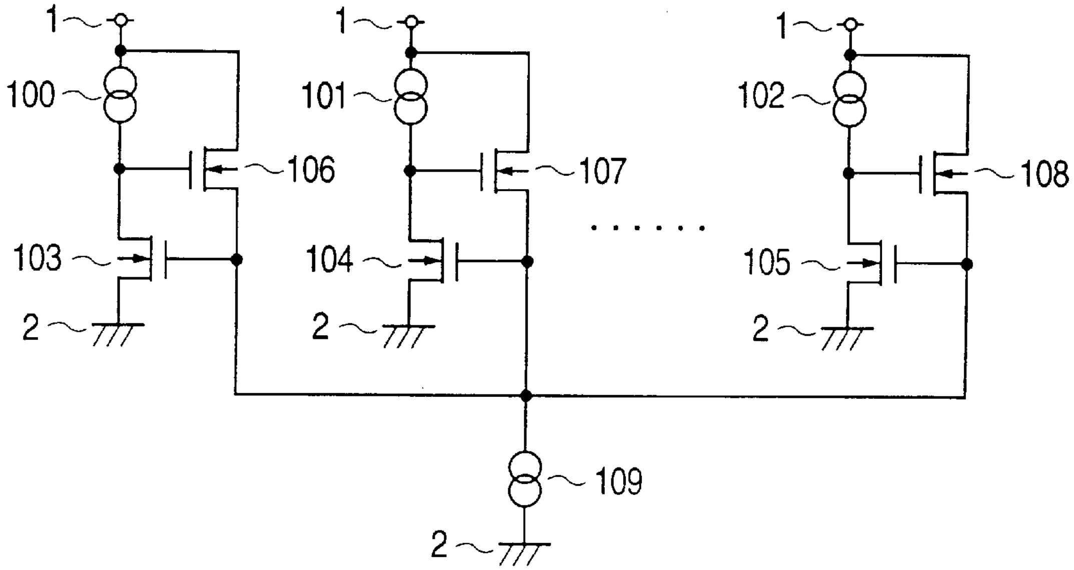
FIG. 1 PRIOR ART
FIG. 1 is a circuit diagram for explaining an example of a maximum position detecting circuit.
Figure 6:
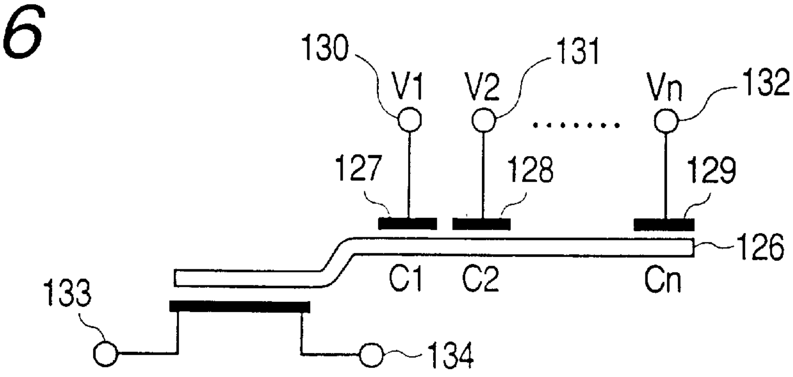
FIG. 6 is a conceptual diagram of a multi-input MOS transistor having a floating gate electrode.

FIG. 6 is a conceptual diagram of a multi-input MOS transistor having a floating gate electrode.

A first gate insulating film is formed on a channel between a source (main electrode) 133 and a drain (main electrode) 134 which are provided on a semiconductor substrate so as to be away from each other, thereby forming a floating gate electrode (control electrode) 126 made of first polysilicon through the first gate insulating film. N input gate electrodes 127, 128, . . . , and 129 made of second polysilicon are formed on the floating gate electrode 126 through a second gate oxide film. The input gate electrodes 127, 128, . . . , and 129 are connected to input terminals 130, 131, . . . , and 132, respectively. As mentioned above, a multi-input device having capacitive couplings of Cl, C2, . . . , and Cn can be realized for the floating gate electrode 126. (In the diagram, the gate insulating film is expressed by a gap between the facing electrodes.)

In case of forming the N input gate electrodes 127, 128, . . . , and 129 which are capacitively coupled to the floating gate electrode 126 as mentioned above, an electric potential of the floating gate electrode 126 is equal to a weighted mean of input voltages applied to a number of input gates. The transistor is turned on or off in dependence on whether the weighted mean value exceeds a threshold value of the transistor or not. Since this operation is similar to that of neuron as a fundamental unit constructing the brain of an organism, such a transistor is called a neuron MOS (hereinafter, abbreviated to νMOS).

Figure 7:
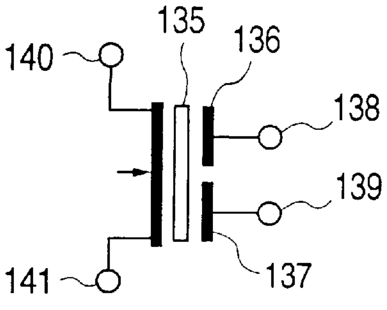
FIG. 7 is a conceptual diagram of a vMOS having a capacitive coupling of two inputs which can be used in the embodiment.

FIG. 7 is a conceptual diagram of the νMOS having a capacitive coupling of two inputs which can be used in the embodiment. The νMOS shown in FIG. 7 is constructed by a drain 140, a source 141, a floating gate electrode 135, input gate electrodes 136 and 137, and input terminals 138 and 139 connected to the input gate electrodes 136 and 137. Now, a capacitance which is formed between the floating gate electrode 135 and input gate electrode 136 is labelled as Cox, a capacitance which is formed between the floating gate electrode 135 and input gate electrode 137 is labelled as Coy, a voltage which is applied to the input terminal 138 is set to Vox, and a voltage which is applied to the input terminal 139 is called Voy. An electric potential ΦF of the floating gate electrode 135 is expressed by the following equation.

$$\Phi F=(Cox\cdot Vox+Coy\cdot Voy)/(Cox+Coy)$$

As mentioned above, the electric potential ΦF of the floating gate electrode 135 is equal to the weighted mean value. The weighted mean value is determined by the capacitive coupling ratio.

[Second Embodiment]

Figure 8:
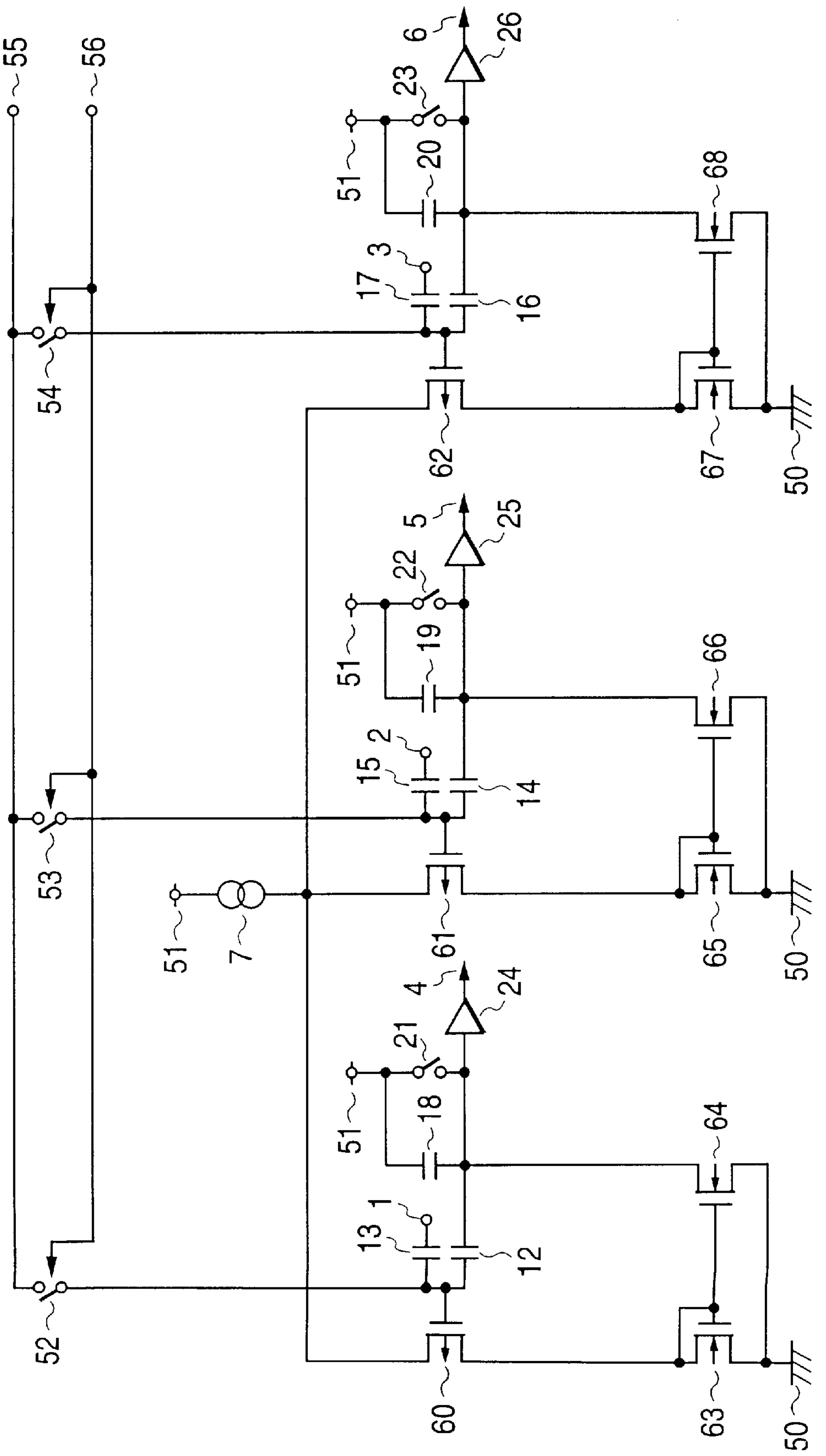
FIG. 8 is a circuit diagram showing the second embodiment of the invention.

FIG. 8 is a circuit diagram of an N-input data minimum position detecting circuit showing the second embodiment of the invention. In case of comparing N data trains, the first input data voltage V1 is inputted to the input terminal 1, the second input data voltage V2 is inputted to the input terminal 2, and the N-th input data voltage Vn is inputted to the input terminal 3. For convenience of explanation, the third to (N−1)th input data are omitted because voltages larger than the input data voltages V1, V2, and Vn are inputted.

The input data voltages V1, V2, and Vn applied to the input terminals 1, 2, and 3 are connected to the capacitive means 13, 15, and 17, respectively. The other terminals of the capacitive means 13, 15, and 17 are connected to the capacitive means 12, 14, and 16 and gate terminals of PMOS transistors 60, 61, and 62, thereby forming first, second, and third floating points, respectively. The switching means 52, 53, and 54 are connected to the first, second, and third floating points and the other terminals of the switching means 52, 53, and 54 are connected to the first reference power source 55, respectively. Source terminals of the PMOS transistors 60, 61, and 62 are commonly connected. The constant current source 7 of the value Iw is connected between the common connecting point and the power source voltage 51. Drain terminals of the PMOS transistors 60, 61, and 62 are connected to NMOS transistors 63, 65, and 67 in each of which a gate and a source are connected. The gate-source common connecting points of the NMOS transistors 63, 65, and 67 are connected to gates of NMOS transistors 64, 66, and 68, respectively. Each pair of NMOS transistors (63 and 64), (65 and 66), and (67 and 68) constructs a current mirror circuit. Mirror values of the drain currents I1, I2, and In of the PMOS transistors 60, 61, and 62 are extracted as drain currents Id64, Id66, and Id68 of the NMOS transistors 64, 66, and 68. Drain terminals of the NMOS transistors 64, 66, and 68 are connected to the capacitive means 18, 19, and 20, capacitive means 12, 14, and 16, switching means 21, 22, and 23, and buffer inverters 24, 25, and 26, thereby constructing fourth, fifth, and sixth floating points, respectively. Processing results of the buffer inverters 24, 25, and 26 are extracted from the output terminals 4, 5, and 6, respectively.

The operation of the minimum data position detecting circuit will now be described with reference to operation principle diagrams shown in FIGS. 9 and 10. Fundamentally, only the output of the circuit to which the minimum data was inputted among the N data groups applied to the input terminals 1, 2, and 3 is set to "L".

Figure 9:
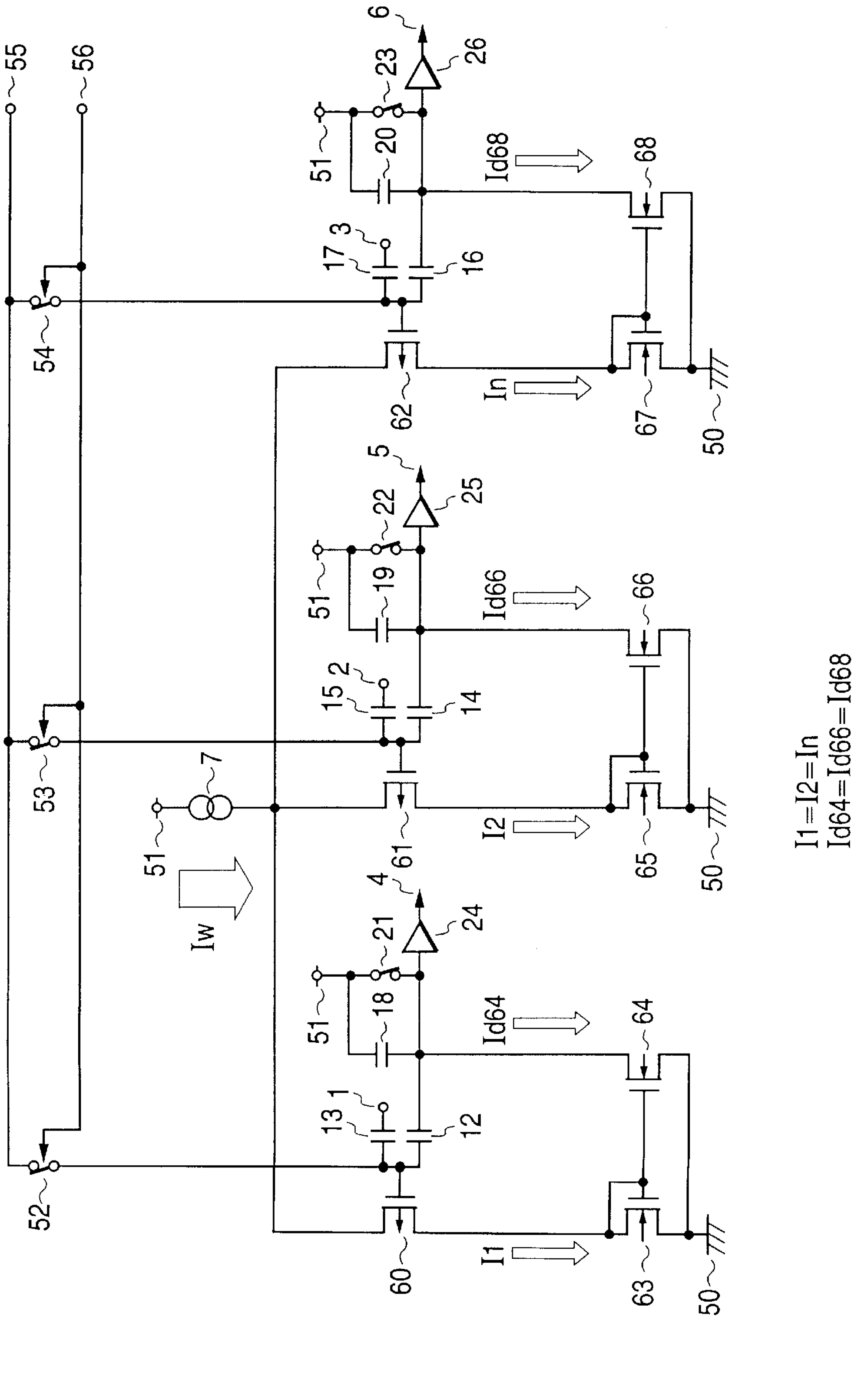
FIG. 9 is an operation explanatory diagram of a resetting mode of the second embodiment.

FIG. 9 is an operation principle diagram of the resetting mode in the embodiment. The resetting mode corresponds to a period of time provided for initial setting of each voltage node before the comparison voltages V1, V2, and Vn are inputted to the input terminals 1, 2, and 3. The first control terminal 56 is activated to turn on the switching means 52, 53, and 54 and the first reference voltage 55 is applied to the input terminals 1, 2, and 3. Thus, the first, second, and third floating points are charged to the first reference voltage 55 and the initial charges of the capacitive means 13, 15, and 17 are set to 0. The switching means 21, 22, and 23 connected to the capacitive means 18, 19, and 20 serving as the fourth, fifth, and sixth floating points are turned on and the initial charges of the capacitive means 18, 19, and 20 are set to 0. In this resetting state, the gate terminals of the PMOS transistors 60, 61, and 62 serving as amplifiers for positive feedback amplification having a common source connection, namely, the first, second, and third floating points are set to the reference voltage 55 for each transistor. Therefore, the drain currents I1, I2, and In of the PMOS transistors 60, 61, and 62 for the positive feedback amplifiers are equalized. The relation of (I1=I2=In) is satisfied (the values of I3 to In−1 omitted in the above description are similarly equal to I1=I2=In). The drain currents I1, I2, and In are mirrored to the NMOS transistors of the current mirror circuit pairs (63 and 64), (65 and 66), and (67 and 68) and are inputted to the fourth, fifth, and sixth floating points as drain currents Id64, Id66, and Id68 of the NMOS transistors 64, 66, and 68 as outputs of the current mirror circuits, respectively. However, since the switching means 21, 22, and 23 are ON, the electric potential is fixed to the power source voltage 51 and does not charge the capacitive means 18, 19, and 20. In the resetting mode, the initial charges of the capacitive means 18, 19, and 20 are set to 0. The constant current Iw of the constant current source 7 is equally divided and shunted to each current input voltage output positive feedback circuit. An operating point is set to (I1=Id64=I2=Id66=In=Id68) by using the current mirror circuits and the apparatus enters a standby mode.

Figure 10:
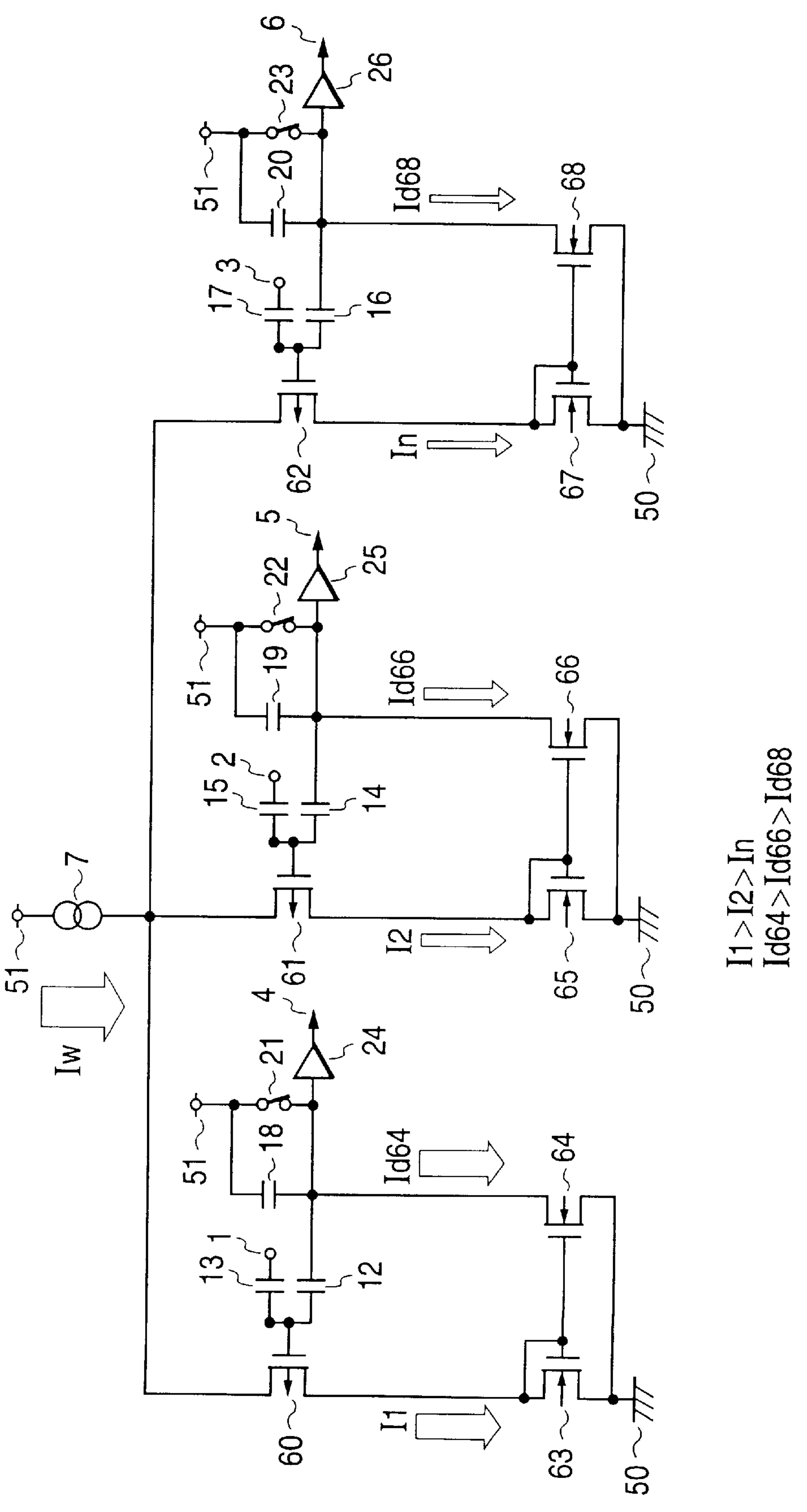
FIG. 10 is an operation explanatory diagram during a minimum position detecting process of the second embodiment.

FIG. 10 is an operation explanatory diagram during the minimum position detecting process after the signal input. When the switching means 52, 53, and 54 are turned off to set the first, second, and third floating points into a perfect floating state and the switching means 21, 22, and 23 are also turned off, the drain currents Id64, Id66, and Id68 start to charge the capacitive means 18, 19, and 20, respectively. When the data groups in which the magnitudes of the input signals have a relation of (V1<V2<Vn) are supplied to the input terminals 1, 2, and 3, gate voltages Vgs60, Vgs61, and Vgs62 of the PMOS transistors 60, 61, and 62 as the first, second, and third floating points rise in accordance with the magnitudes of the input signals. Since the input voltages have the relation of (V1<V2<Vn), a relation of (Vgs60<Vgs61<Vgs62) is derived. In this instance, since the gate potential Vgs60 of the PMOS transistor 60 is the lowest, the drain current I1 of the PMOS transistor 60 increases. Since the current Iw of the predetermined value is always supplied from the constant current source 7 to the commonly connected source terminals serving as a current supply source of the PMOS transistors 60, 61, and 62 for the positive feedback amplifiers, the drain current I1 of the PMOS transistor 60 increases, so that the drain currents of the other PMOS transistors decrease. Consequently, the drain currents have a relation of (I1>I2>In). The drain currents are inputted to the current mirror circuits (63 and 64), (65 and 66), and (67 and 68), thereby charging the capacitive means 18, 19, and 20. The capacitive means 18, 19, and 20 are connected to the gate terminals of the PMOS transistors 60, 61, and 62 through the capacitive means 12, 14, and 16, thereby forming a positive feedback closed loop. That is, since the drain current I1 is mirrored and becomes Id64 and charges the capacitive means 18, the electric potential drops and the gate voltage Vgs60 of the PMOS transistor 60 is further reduced through the capacitive means 12. Therefore, the positive feedback effect to raise the drain current I1 further acts. As for the positive feedback effect, as the drain current of the PMOS transistor for the positive feedback amplifier is larger, an increase rate is larger. Since the current value Iw of the constant current source 7 set to the source common connecting terminal of each PMOS transistor for the positive feedback amplifier is constant, the drain currents have a relation of (I1>>I2>>In). Since the relation of (Iw=I1+I2+ . . . +In) is always satisfied, I2 and In are reduced by the increase amount of I1. In this manner, the concentration of the current into the circuit which received the minimum input voltage is started.

Figure 11:
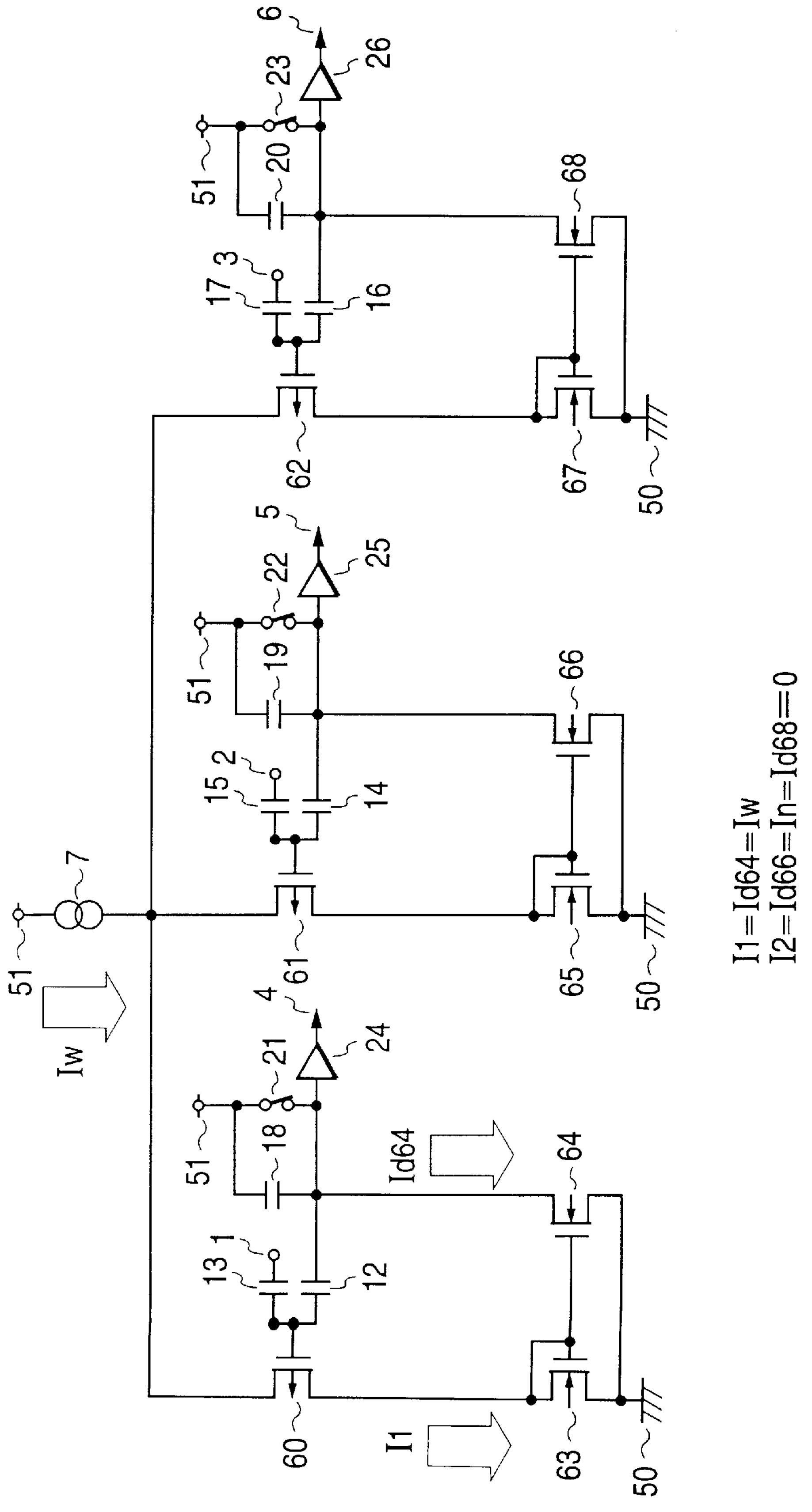
FIG. 11 is an operation explanatory diagram at the end of the maximum position detecting process of the second embodiment.

FIG. 11 is an operation explanatory diagram at the end of the minimum position detection of the input data. A competing function such that the increase in drain current I1 of the PMOS transistor 60 which received the minimum input voltage is accelerated and enhanced by the positive feedback loop and the drain currents of the other PMOS transistors for the positive feedback amplifiers are reduced occurs. Finally, since the current value Iw of the constant current source 7 set at the source common connecting terminal of each PMOS transistor for the positive feedback amplifier is constant, the current of the constant current source 7 is concentrated to the PMOS transistor 60 which received the minimum input voltage and is not distributed to the other transistors. That is, the relations of (I1=Iw and I2=In=0) are obtained and the circuit loop is converged. Therefore, the relations of (Id64=Iw and Id66=Id68=0) are obtained and the capacitive means 18 is finally charged to the ground potential. Since the capacitive means 19 and 20 satisfy the relation of (I2=In=0), after they were charged to predetermined amounts, no current is supplied and the decrease in electric potential is stopped. By setting proper logic threshold values into the buffer inverters 24, 25, and 26, only the charged voltage of the capacitive means 18 exceeds the logic threshold value, only the output terminal 4 is set to "L", and the other output terminals 5 and 6 are fixed to "H". As mentioned above, only the circuit which received the minimum input signal is activated to "L", thereby enabling the storing position of the data to be detected. By the positive feedback effect, the current of the constant current source which is commonly connected to the inputs of all of the current input voltage output positive feedback loop circuits is finally concentrated and supplied as a whole to the current input voltage output positive feedback loop circuit which received the minimum input voltage. Therefore, even when there are slight differences among the input analog signals, the output of only the cell of the minimum input is activated, the minimum position detection of the input analog signal at high precision is realized by the circuit having a small number of elements, and the integration degree is remarkably improved. By setting the operating region of the MOS transistor into the sub threshold region, the parallel processes of the minimum input position detection of a low electric power consumption and a large scale can be realized.

[Third Embodiment]

Figure 12:
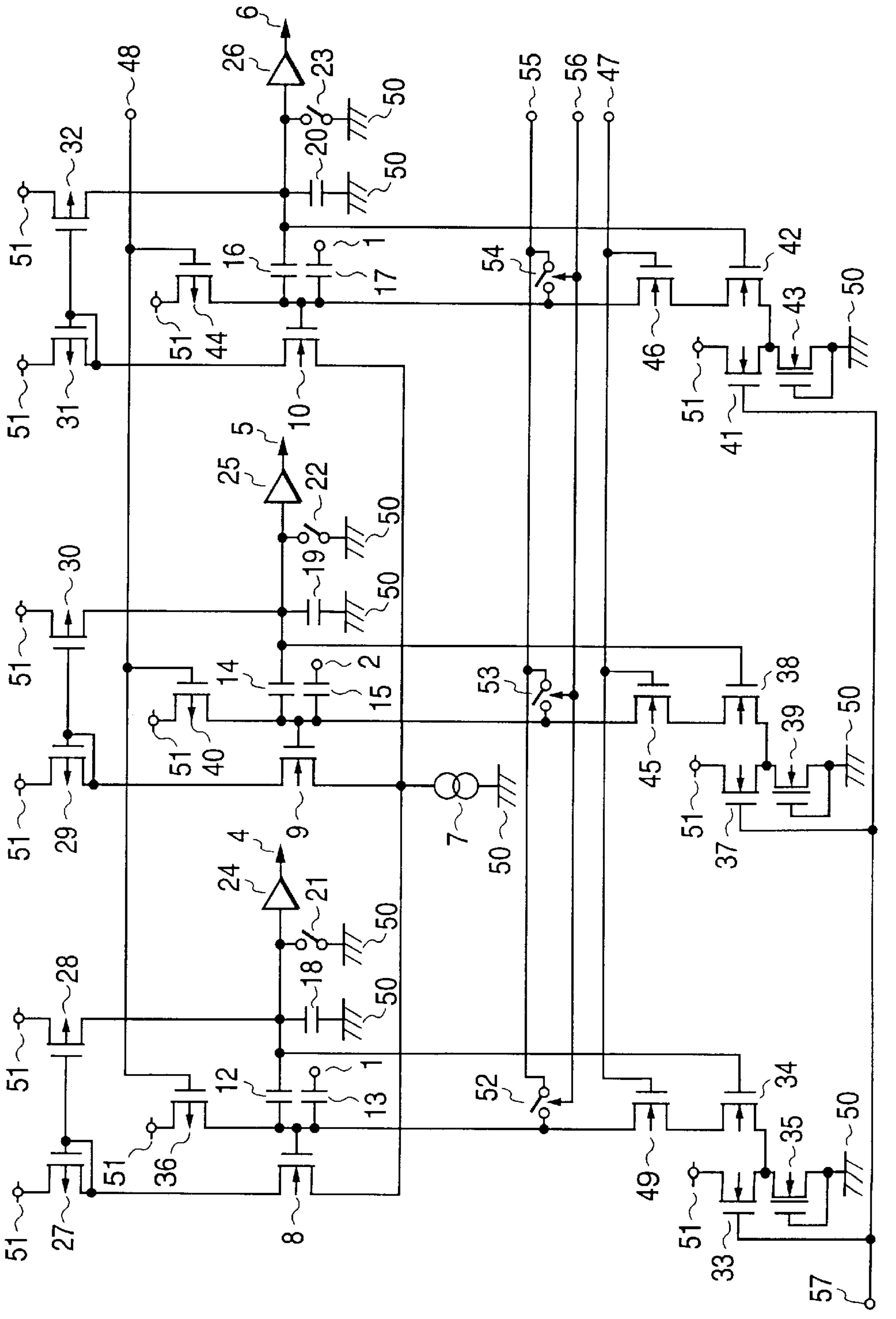
FIG. 12 is a circuit diagram showing the third embodiment of the invention.

FIG. 12 is a circuit diagram showing the third embodiment of the invention. In FIG. 12, component elements shown by reference numerals 1 to 32 and 52 to 55 have the same construction as those in the first embodiment described above. In the embodiment, a drain terminal of a PMOS transistor 36 and a drain terminal of an NMOS transistor 49 are connected to the first floating point as a common connecting point of the NMOS transistor 8, capacitive means 12, and capacitive means 13. A gate terminal of the PMOS transistor 36 is connected to a second control terminal 48 and a source terminal is connected to a power source voltage Vdd51. A gate terminal of the NMOS transistor 49 is connected to a third control terminal 47 and a source terminal is connected to a drain terminal of an NMOS transistor 34. The PMOS transistor 36 operates as a switching control type constant current source. The NMOS transistor 49 operates as a pass transistor.

A source of the NMOS transistor 34 is connected to a source of an NMOS transistor 33. A differential amplifier is constructed by those two pairs of transistors. Source and gate terminals of a depletion type NMOS transistor 35 are connected to the ground potential 50 and the transistor 35 acts as a constant current source. A drain terminal as an output of the transistor 35 is connected to a source common connecting point of the NMOS transistors 33 and 34. The drain terminal of the NMOS transistor 34 corresponds to the output of the differential amplifier. The drain terminal of the NMOS transistor 33 is connected to the power source voltage Vdd51. A gate terminal of the NMOS transistor 34 is a − input terminal of the differential amplifier and is connected to the fourth floating point and the capacitive means 12. The gate terminal of the NMOS transistor 33 serving as a + input terminal of the differential amplifier is connected to a second reference power source 57.

In the embodiment, the circuit added to the first embodiment is an offset cancelling circuit such that even if the threshold values of Vth of the MOS transistors vary and an offset occurs in the inputs of the circuit, it is set off. As a circuit operation, there are an offset cancelling mode and a comparison arithmetic operating mode. In the offset cancelling mode, the second control terminal 48 is set to a DC voltage such that a drain current of a predetermined value is supplied to the gate of the PMOS transistor 36 for the switching control constant current source, the signal at the "H" level is supplied from the third control terminal 47 to the gate of the NMOS transistor 49 serving as a pass transistor, and the transistor 49 is conductive. In the comparison arithmetic operating mode, the second control terminal 48 is set to a DC voltage to turn off the drain current to the gate of the PMOS transistor 36 for the switching control constant current source, a signal at the "L" level is supplied from the third control terminal 47 to the gate of the NMOS transistor 49 serving as a pass transistor, and the transistor 49 is nonconductive. Since the operation in the comparison arithmetic operating mode is substantially the same as that in the first embodiment described in FIGS. 2 to 5, its description is omitted here.

The offset cancelling mode as a maximum feature in the third embodiment will now be described. The second control terminal 48 is set to a DC voltage such that a drain current of a predetermined value is supplied to the gate of the PMOS transistor 36 for the switching control constant current source. When the signal at the "H" level is supplied from the third control terminal 47 to the gate of the NMOS transistor 49 serving as a pass transistor and the transistor 49 is conductive, the drain terminal of the NMOS transistor 34 as an output of a differential amplifier constructed by the NMOS transistors 33, 34, and 35 and the drain terminal of the PMOS transistor 36 for the switching control constant current source are connected to the first floating point as a common connecting point of the NMOS transistor 8, capacitive means 12, and capacitive means 13. A current of a difference as an output of the differential amplifier between the drain current of the NMOS transistor 34 and the drain current of the PMOS transistor 36 for the switching control constant current source charges or discharges the first floating point, thereby increasing or decreasing the floating potential. The gate terminal of the NMOS transistor 34 as a − input terminal of the differential amplifier is connected to the capacitive means 12 as the fourth floating point. The gate terminal of the NMOS transistor 33 as a + input terminal of the differential amplifier is connected to the second reference power source 57. Therefore, the differential amplifier forms a negative feedback loop system such as to equalize the voltages at the + input terminal and the − input terminal. That is, the system is converged so as to equalize the potential differences across both of the input terminals. By this loop, for example, even if the value of Vth of the NMOS transistor 8 largely fluctuates and the drain current Id28 to charge the capacitive means 18 largely fluctuates, the negative feedback loop system comprising the differential amplifier acts and the electric potential of the fourth floating point is controlled so as to be equal to the second reference power source 57. For example, in the case where Vth of the NMOS transistor 8 is large, the drain current I1 increases, the drain current Id28 of the PMOS transistor 28 as a mirror current of such a current increases, and the electric potential of the fourth floating point is set to be higher than the standard value, the drain current of the NMOS transistor 34 increases and by reducing the gate potential of the NMOS transistor 8, the currents I1 and Id28 are decreased, thereby converging the fourth floating point to the second reference power source 57. In the case where Vth of the NMOS transistor 8 is small, the drain current I1 decreases, the drain current Id28 of the PMOS transistor 28 as a mirror current of such a current decreases, and the electric potential of the fourth floating point is set to be lower than the standard value, the drain current of the NMOS transistor 34 decreases and by raising the gate potential of the NMOS transistor 8, the currents of I1 and Id28 are increased, thereby converging the fourth floating point to the second reference power source 57 and cancelling the offset of the circuit.

Similarly, a drain terminal of a PMOS transistor 40 as a switching control type constant current source and a drain terminal of an NMOS transistor 45 as a pass transistor are connected to the second floating point as a common connecting point of the NMOS transistor 9, capacitive means 14, and capacitive means 15. A drain terminal of an NMOS transistor 38 as an output of a differential amplifier constructed by NMOS transistors 37, 38, and 39 is connected to a source terminal of the NMOS transistor 45. A gate terminal of the NMOS transistor 38 as a – input terminal of the differential amplifier is connected to the capacitive means 14 as a fifth floating point. A gate terminal of the NMOS transistor 37 as a + input terminal of the differential amplifier is connected to the second reference power source 57, thereby constructing the second maximum input position detecting circuit.

Similarly, a drain terminal of a PMOS transistor 44 as a switching control type constant current source and a drain terminal of an NMOS transistor 46 as a pass transistor are connected to the third floating point as a common connecting point of the NMOS transistor 10, capacitive means 16, and capacitive means 17. A drain terminal of an NMOS transistor 42 as an output of a differential amplifier constructed by NMOS transistors 41, 42, and 43 is connected to a source terminal of the NMOS transistor 46. A gate terminal of the NMOS transistor 42 as a – input terminal of the differential amplifier is connected to the capacitive means 16 as a sixth floating point. A gate terminal of the NMOS transistor 41 as a + input terminal of the differential amplifier is connected to the second reference power source 57, thereby constructing the N-th maximum input position detecting circuit. In the offset cancelling mode described in the first maximum input position detecting circuit, each differential amplifier controls the drain currents I2 and In of the NMOS transistors 9 and 10 in accordance with a variation of the threshold values Vth of the MOS transistors, thereby absorbing the Vth variation of the MOSs among the circuits. The maximum input position detecting circuit which can perform the high precision parallel processes in which the offset was cancelled can be realized.

In the embodiment, the offset cancelling circuit is added to the maximum input position detecting circuit in the first embodiment. However, an offset cancelling circuit in which a conductivity type or the like of an MOS transistor is properly changed can be also added to the minimum input position detecting circuit described in the second embodiment.

According to the invention as described above, in the parallel processing circuit for detecting the storing position of the maximum or minimum input signal among a plurality of inputs, one constant current source is distributed to the parallel comparing circuits comprising the positive feedback loop, the whole current of the constant current source is finally concentrated into the comparing circuit which received the maximum or minimum input signal, and the storing position of the largest or smallest signal in the input signal group can be accurately detected by detecting such a state. By properly setting the loop gain of the positive feedback loop, the discrimination of the analog input signals having small differences is realized. The parallel retrieval of a number of analog signals can be performed.

Further, according to the invention, the output of the differential amplifier of which – and + input terminals are connected to the positive feedback loop circuit and the reference power source is connected to the floating input node of the positive feedback loop, thereby constructing such that the detected offset of the positive feedback loop circuit is cancelled by the negative feedback loop comprising the differential amplifier. Even if the offset due to the Vth variation occurs in the insulating gate type transistor constructing the circuit, it is cancelled and the parallel comparison of a number of analog signals at high precision can be performed.

According to the invention, the perfect parallel signal processes which need a large number of circuit elements and a large electric power consumption in the existing binary digital circuit are analog processed at high precision by using the invention. Thus, the integration degree is raised by the simple circuit construction and the circuit can be constructed by a low electric power consumption. The real-time performance of the signal processes can be remarkably improved.

What is claimed is:

1. A semiconductor integrated circuit in which a plurality of circuit units each of which is constructed in a manner such that a gate of an insulating gate type transistor is connected to a signal input terminal through a first capacitance, a common connecting point serving as a floating point of said gate and said first capacitance is connected to one terminal side of a second capacitance, and a controller, arranged to fluctuate a voltage on the other terminal side of said second capacitance so as to further increase or decrease the drain current of said insulating gate type transistor in correspondence to an increase or decrease of said drain current of said insulating gate type transistor is connected between a drain of said insulating gate type transistor and the other terminal side of said second capacitance are provided, and sources of said insulating gate type transistors of said plurality of circuit units are commonly connected and are connected to a constant current source, wherein each of said circuit units constructs a positive feedback loop for further increasing or decreasing said drain current in accordance with an increase or decrease of a source current of said insulating gate type transistor.

2. A circuit according to claim 1, further having a terminal for outputting a maximum voltage position or a minimum voltage position with respect to a signal voltage which is applied to each signal input terminal of said plurality of circuit units by the voltage on the other terminal side of said second capacitance.

3. A circuit according to claim 1, wherein a signal which is outputted from the other terminal side of said second capacitance is inputted to a comparator for comparing the signal outputted from the other terminal side of said second capacitance with a reference electric potential, and almost all of the current of said constant current source is finally concentrated and inputted from said source by a positive feedback effect to the circuit unit to which the largest one of the signal voltages which are applied to said signal input terminals of said plurality of circuit units is inputted, so that only the output of said comparator connected to said circuit unit is activated.

4. A circuit according to claim 1, wherein a signal which is outputted from the other terminal side of said second capacitance is inputted to a comparator for comparing with a reference electric potential, and almost all of the current of said constant current source is finally concentrated and inputted from said source by a positive feedback effect to the circuit unit to which the smallest one of the signal voltages which are applied to said signal input terminals of said plurality of circuit units is inputted, so that only the output of said comparator connected to said circuit unit is activated.

5. A circuit according to claim 1, wherein when said insulating gate type transistor is a first insulating gate type transistor, said controller comprises: a current mirror circuit constructed by a second insulating gate type transistor of a conductivity type opposite to a conductivity type of said first insulating gate type transistor; and a third capacitance in which one terminal side is connected to the output side of said current mirror circuit and the other terminal side of said second capacitance, an input side of said current mirror circuit is connected to a drain of said first insulating gate type transistor, and the other terminal of said third capacitance is connected to a low voltage side power source potential or a high voltage side power source potential.

6. A circuit according to claim 1, wherein the other terminal of each of said second capacitance of said plurality of circuit units is connected to a low voltage side power source potential or a high voltage side power source potential through a first switch, respectively, and a second switch is provided for setting electric potentials of all of the signal input terminals of said plurality of circuit units to a same reset potential, thereby turning on said first switch and enabling a resetting operation to set an electric potential of the other terminal of said second capacitance to the low voltage side power source potential or high voltage side power source potential.

7. A circuit according to claim 1, further comprising a plurality of voltage input current output differential amplifiers corresponding to said plurality of circuit units, and wherein an inverting input terminal of each of said voltage input current output differential amplifiers is connected to the other terminal of the second capacitance of said corresponding circuit unit, an output of each of said voltage input current output differential amplifiers is connected to said one terminal of the second capacitance of said corresponding circuit unit, a non-inverting input terminal of each of said voltage input current output differential amplifiers is commonly connected and is connected to a reference power source potential, and said voltage input current output differential amplifier constructs an offset correcting circuit.

8. A circuit according to claim 7, wherein the output of said voltage input current output differential amplifier of said offset correcting circuit and said one terminal of said second capacitance are connected through a switch.

9. A circuit according to claim 8, wherein said switch operates during a maximum voltage position or minimum voltage position detecting operation with respect to the signal voltage which is inputted to each of said signal input terminals or only in cycles other than a time during a resetting operation and is used to disconnect said voltage input current output differential amplifier or to stop an operation of said voltage input current output differential amplifier in an inoperative mode.

10. A circuit according to claim 1, wherein said insulating gate type transistor and said first and second capacitance are formed by a transistor in which a floating gate electrode is formed through a first gate oxide film onto a channel region between source and drain regions provided on a semiconductor substrate so as to be away from each other and two gate electrodes which are electrically insulated from each other are formed on said floating gate electrode through a second gate oxide film.

* * * * *

UNITED STATES PATENT AND TRADEMARK OFFICE

CERTIFICATE OF CORRECTION

PATENT NO. : 6,127,852

DATED : October 3, 2000

INVENTOR(S) : Katsuhisa et al.

It is certified that error appears in the above-identified patent and that said Letters Patent is hereby corrected as shown below:

Column 4,
Line 46, "vMOS" should read -- υMOS --.

Signed and Sealed this

Thirtieth Day of October, 2001

*Attest:*

Nicholas P. Godici

NICHOLAS P. GODICI

*Attesting Officer* *Acting Director of the United States Patent and Trademark Office*